US009426902B2

(12) United States Patent
Liu (10) Patent No.: US 9,426,902 B2
(45) Date of Patent: Aug. 23, 2016

(54) PRINTED CIRCUIT BOARD, AND METHOD AND APPARATUS FOR DRILLING PRINTED CIRCUIT BOARD

(71) Applicant: Huawei Technologies Co., Ltd., Shenzhen, Guangdong (CN)

(72) Inventor: Shandang Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 188 days.

(21) Appl. No.: 14/081,569

(22) Filed: Nov. 15, 2013

(65) Prior Publication Data

US 2014/0093321 A1  Apr. 3, 2014

Related U.S. Application Data

(63) Continuation of application No. PCT/CN2013/074818, filed on Apr. 26, 2013.

(30) Foreign Application Priority Data

Sep. 28, 2012  (CN) .......................... 2012 1 0372106

(51) Int. Cl.
| | |
|---|---|
| H05K 3/04 | (2006.01) |
| H05K 3/42 | (2006.01) |
| B23B 49/00 | (2006.01) |
| B23B 35/00 | (2006.01) |
| B23B 41/14 | (2006.01) |
| H05K 3/00 | (2006.01) |

(52) U.S. Cl.
CPC ................. *H05K 3/42* (2013.01); *B23B 35/00* (2013.01); *B23B 41/14* (2013.01); *B23B 49/00* (2013.01);
(Continued)

(58) Field of Classification Search
CPC .................. H05K 3/0047; H05K 2203/0207; H05K 2203/1572; B23B 35/00; B23B 41/00; B23B 41/14; B23B 2226/27; B23B 2251/426; Y10T 408/03; Y10T 408/173; Y10T 408/20
USPC ............................................... 408/1 R, 12, 15
See application file for complete search history.

(56) References Cited

U.S. PATENT DOCUMENTS 5,231,885 A * 8/1993 Suzuki ..................... G01N 3/58
73/862.08
6,481,939 B1 * 11/2002 Gillespie ............ B23Q 17/2233
408/1 R
(Continued)

FOREIGN PATENT DOCUMENTS

CN          1787726 A     6/2006
CN   WO 2010127496 A1 * 11/2010   ......... H05K 3/0047
(Continued)

*Primary Examiner* — Sunil K Singh
*Assistant Examiner* — Alan Snyder (57) ABSTRACT

The present invention relates to a method for drilling a printed circuit board, comprising: drilling down in an initial position, and when contacting a live superficial conductive layer of a PCB, acquiring a first conductive position and acquiring a first height difference between the initial position and the first conductive position; drilling onward after the first drill bit of the driller drills through the superficial conductive layer and when contacting another conductive layer of the PCB, acquiring a second conductive position and acquiring a second height difference between the initial position and the second conductive position; calculating a difference between the second and the first height difference to obtain a third height difference; and performing back-drilling, according to the third height difference, in a position that needs back-drilling. The present invention acquires precise depth information through a test blind via and reduces Stub length of back-drilling.

14 Claims, 3 Drawing Sheets

(52) U.S. Cl.
CPC ......... *H05K 3/0047* (2013.01); *B23B 2226/27* (2013.01); *B23B 2251/426* (2013.01); *H05K 2203/0207* (2013.01); *H05K 2203/1476* (2013.01); *H05K 2203/1572* (2013.01); *Y10T 408/03* (2015.01); *Y10T 408/05* (2015.01)

(56) References Cited

U.S. PATENT DOCUMENTS

| | | | |
|---|---|---|---|
| 7,337,537 B1* | 3/2008 | Smetana, Jr. | H05K 3/429 29/846 |
| 8,151,455 B2* | 4/2012 | Hamada | H05K 3/0047 29/847 |
| 2002/0066179 A1 | 6/2002 | Hall et al. | |
| 2005/0128672 A1 | 6/2005 | Tourne et al. | |
| 2006/0180346 A1 | 8/2006 | Knight et al. | |

FOREIGN PATENT DOCUMENTS

| | | | |
|---|---|---|---|
| CN | 102883522 A | 1/2013 | |
| DE | 3206354 A1 * | 9/1983 | ......... B23Q 17/2233 |

\* cited by examiner

PRINTED CIRCUIT BOARD, AND METHOD AND APPARATUS FOR DRILLING PRINTED CIRCUIT BOARD

CROSS-REFERENCE TO RELATED APPLICATIONS

This application is a continuation of International Application No. PCT/CN2013/074818, filed on Apr. 26, 2013, which claims priority to Chinese Patent Application No. 201210372106.5, filed on Sep. 28, 2012, both of which are hereby incorporated by reference in their entireties.

TECHNICAL FIELD

The present invention relates to the technical field of manufacturing a printed circuit board (Printed Circuit Board, PCB), and in particular to a printed circuit board, and a method and an apparatus for drilling a printed circuit board.

BACKGROUND

With rapid development of radio and network communications technologies, working frequencies of communications products are increasingly high. The increase of the working frequencies of communications products imposes higher requirements on loss control in a transmission process. Back-drilling a PCB is a technological processing manner that effectively reduces the loss of a hole. After the back-drilling, if the length of a redundant hole copper (Stub) above a signal layer is smaller, the loss is less.

In the prior art, a plated through hole (Plated Through Hole, PTH) is back-drilled generally according to pre-computed theoretic back-drilling depth, and the Stub length of the back-drilling is tested according to a conventional back-drilling test coupon (Coupon) on an edge of the PCB production board, and then slicing analysis is performed to rectify the back-drilling depth. Because the workload of depth detection is large, the Coupon back-drilling depth is usually detected through slicing according to production batches. That is, back-drilling depth is not rectified for all PCB boards. Due to unevenness of thickness of PCB boards, the PCB boards in a same batch have different thicknesses to some extent, and the thickness even varies with positions on a same PCB board. The defects of the prior art are: The back-drilling depth acquired according to a test result in a conventional back-drilling Coupon position on an edge of the PCB board deviates from the depth in an actual back-drilling position on the PCB board. For a thicker PCB board, the absolute value of the deviation is greater, and the deviation of the back-drilling depth is greater.

Functions implemented by a PCB board are more and more complex, and the level of integration is increasing. Correspondingly, the PCB board needs to have more layers and be thicker to meet functionality design requirements of the PCB board. However, the deviation of the back-drilling depth acquired according to the test result in a back-drilling Coupon position on an edge of the PCB board is relatively great, and therefore Stub length is relatively great, which causes a significant impact on loss of a hole during high-frequency signal transmission.

SUMMARY

Embodiments of the present invention provide a PCB, and a method and an apparatus for drilling a PCB, which may reduce loss of a hole in a high-speed high-frequency signal transmission process by reducing Stub length of back-drilling.

According to one aspect, an embodiment of the present invention provides a PCB, where the PCB includes a plurality of conductive layers and insulation layers isolating the conductive layers. The PCB includes a plurality of partitions, and each partition includes:

a test blind via, positioned in a test Coupon zone and includes a first blind via and a second blind via whose aperture is smaller than that of the first blind via, where the two blind vias are coaxial, the first blind via is positioned between a superficial conductive layer of the test Coupon zone and an adjacent conductive layer, the second blind via is positioned under the first blind via, and the bottom of the second blind via is positioned on a surface of, inside, or under another conductive layer, so that the another conductive layer is exposed to the inside of the second blind via; and a through hole, whose inner wall forms a conductive layer, where:

a part of the another conductive layer exposed to the inside of the second blind via is used to form a test circuit loop with a second drill bit that drills the second blind via, the conductive layer on the inner wall of the through hole, the superficial conductive layer, and a control circuit of a driller, so that the driller acquires an electrical signal and locates the bottom position of the test blind via.

According to another aspect, an embodiment of the present invention provides a method for drilling a PCB, and the method includes:

drilling down, by a first drill bit of a driller, in an initial position; and when contacting a live superficial conductive layer of a test Coupon zone of a PCB, acquiring, by the driller, a first electrical signal to determine a first conductive position and acquiring a first height difference between the initial position and the first conductive position;

drilling onward, by a second drill bit, after the first drill bit of the driller drills through the superficial conductive layer; and when contacting another conductive layer of the test Coupon zone of the PCB, acquiring, by the driller, a second electrical signal to determine a second conductive position and acquiring a second height difference between the initial position and the second conductive position;

calculating a difference between the second height difference and the first height difference to obtain a third height difference; and performing back-drilling, according to the third height difference, in a position that corresponds to the test Coupon zone and needs back-drilling.

According to still another aspect, an embodiment of the present invention provides an apparatus for drilling a PCB. The apparatus is configured to drill a PCB, where the PCB includes a plurality of conductive layers and insulation layers isolating the conductive layers. The apparatus includes a main unit, a first drill bit, and a second drill bit whose aperture is smaller than that of the first drill bit.

The main unit includes a controller, where: the controller includes a control circuit and a sensor; the control circuit controls the first drill bit to drill down in an initial position until a superficial conductive layer of a test Coupon zone of the PCB is drilled through; when the first drill bit contacts the superficial conductive layer, the sensor acquires a first electrical signal to determine a first conductive position and acquires a first height difference between the initial position and the first conductive position; the control circuit controls the second drill bit to drill onward in a position where the first drill bit drills through the superficial conductive layer; and when the second drill bit contacts another conductive layer of the test Coupon zone of the PCB, the sensor acquires a second electrical signal to determine a second conductive position and acquires a second height difference between the initial position and the second conductive position.

The main unit calculates a difference between the second height difference and the first height difference to obtain a third height difference, and controls a back-drilling drill bit to perform back-drilling, according to the third height difference, in a position that corresponds to the test Coupon zone and needs back-drilling.

In the embodiments of the present invention, when back-drilling needs to be performed on a PCB that has a plurality of partitions, each of which includes a test blind via, a first drill bit of a driller drills down in an initial position, and when the first drill bit contacts a live superficial conductive layer of a test Coupon zone of the PCB, the driller acquires a first electrical signal to determine a first conductive position and acquires a first height difference between the initial position and the first conductive position; a second drill bit of the driller drills onward, and when the second drill bit contacts another conductive layer of the test Coupon zone of the PCB, the driller acquires a second electrical signal to determine a second conductive position and acquires a second height difference between the initial position and the second conductive position; a difference between the second height difference and the first height difference is calculated to obtain a third height difference; and back-drilling is performed according to the third height difference in a position that corresponds to the test Coupon zone and needs back-drilling. Therefore, the embodiments of the present invention can acquire precise depth information through a test blind via, reduce Stub length of back-drilling, implement high-precision back-drilling for a PCB board, and therefore reduce loss of a hole in a high-speed high-frequency signal transmission process and improve integrity of a transmitted signal.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
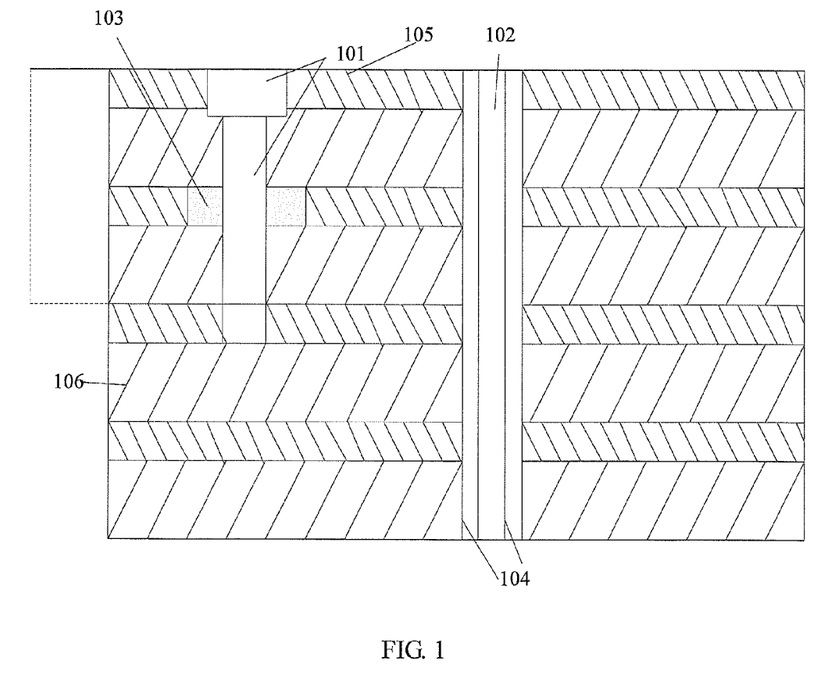
FIG. 1 is a schematic cross-section diagram of a PCB according to an embodiment of the present invention.

The following expounds the PCB provided in an embodiment of the present invention with reference to FIG. 1. FIG. 1 is a schematic cross-section diagram of a PCB according to an embodiment of the present invention.

As shown in FIG. 1, the PCB provided in an embodiment of the present invention includes a plurality of conductive layers 105 and insulation layers 106 isolating the conductive layers. The PCB includes a plurality of partitions, and each partition includes a test blind via 101 and a through hole 102. A conductive layer is formed on the hole wall of the through hole 104.

The test blind via 101 is positioned in a test Coupon zone and includes a first blind via and a second blind via whose aperture is smaller than that of the first blind via, where the two blind vias are coaxial, the first blind via is positioned between a superficial conductive layer of the test Coupon zone and an adjacent conductive layer, the second blind via is positioned under the first blind via, and the bottom of the second blind via is positioned on a surface of, inside, or under another conductive layer, so that the another conductive layer is exposed to the inside of the second blind via.

Unevenness of thickness of the PCB leads to a relatively great deviation of back-drilling depth. Therefore, the PCB provided in the embodiment of the present invention may be divided into rectangular partitions according to thickness, for example, divided into partitions in the form of Sudoku; or divided into concentric strip-shaped partitions according to thickness, for example, divided into partitions from a center gradually to the periphery; or divided into irregular partitions according to a thickness difference. For each partition, a test Coupon zone may be designed to measure the back-drilling depth of the through hole that needs back-drilling in the partition.

Preferably, if other conductive layer exists between the superficial conductive layer and the another conductive layer, insulation must be performed on the other conductive layer, for example, by setting an isolation pad 104.

The thickness of a PCB board is not even. That is, the thickness in different positions of one PCB board is different. In order to control a relatively small Stub length of back-drilling when back-drilling is performed in different positions of the PCB board, a zone where PCBs have the same thickness should be treated as one partition, or a zone where thickness errors of PCB boards are less than a preset threshold should be treated as one partition. After the partitioning, a test Coupon zone is arranged for a through hole that needs back-drilling in each partition. The depth of the back-drilling to be back-drilled is tested through the test Coupon zone, t, so as to control a relatively small Stub length of the back-drilling.

Specifically, the test Coupon zone is also a part of the PCB board, and therefore, the test Coupon zone also has a superficial layer and a bottom layer, the superficial layer of the test Coupon zone has a superficial conductive layer, and the bottom layer is another conductive layer, but the bottom layer can be drilled through. An insulation zone exists between the superficial conductive layer and the another conductive layer. That is, if other conductive layer exists between the superficial layer and the bottom layer, an insulation pad is designed on the other conductive layer.

A pad or copper coating is arranged on the superficial conductive layer of the test Coupon zone, and is also designed on the surface of the another conductive layer.

In the situation in which a plurality of types of back-drilling exist in a same partition, a plurality of test Coupon zones may be designed in the partition, so as to acquire back-drilling depth of a plurality of through holes separately. Alternatively, in the situation in which a plurality of types of back-drilling exist in a same partition, because one PCB board has a plurality of layer structures, the partition may also be designed with only one test Coupon zone, and a pad or copper coating may be designed on a plurality of inner layers of the PCB board separately. In this way, the blind via can be drilled repeatedly in the same test Coupon zone position to acquire back-drilling depth of a plurality of through holes.

It should be noted that the test Coupon zone may be designed on an edge of the PCB board, and a redundant PCB board may be arranged in each partition as a test Coupon zone.

A conductive layer is formed on the inner wall of the through hole 102.

In the test Coupon zone, apart of the another conductive layer exposed to the inside of the second blind via is used to form a test circuit loop with a second drill bit that drills the second blind via, the conductive layer on the inner wall of the through hole, the superficial conductive layer, and a control circuit of a driller, so that the driller acquires an electrical signal and locates the bottom position of the test blind via.

Therefore, according to the distance between the position of the superficial conductive layer and the bottom position of the test blind via, the driller calculates the depth of the blind via, and performs compensation for the depth to obtain the depth of the back-drilling to be back-drilled.

Therefore, the PCB provided in the embodiment of the present invention is partitioned according to a thickness difference of each zone, and a test Coupon zone is set. In this way, a blind via may be drilled in the test Coupon zone to acquire precise depth information, so as to implement high-precision back-drilling, control a smaller Stub, reduce loss of a hole in a high-speed high-frequency signal transmission process, and improve integrity of a transmitted signal.

Figure 2:
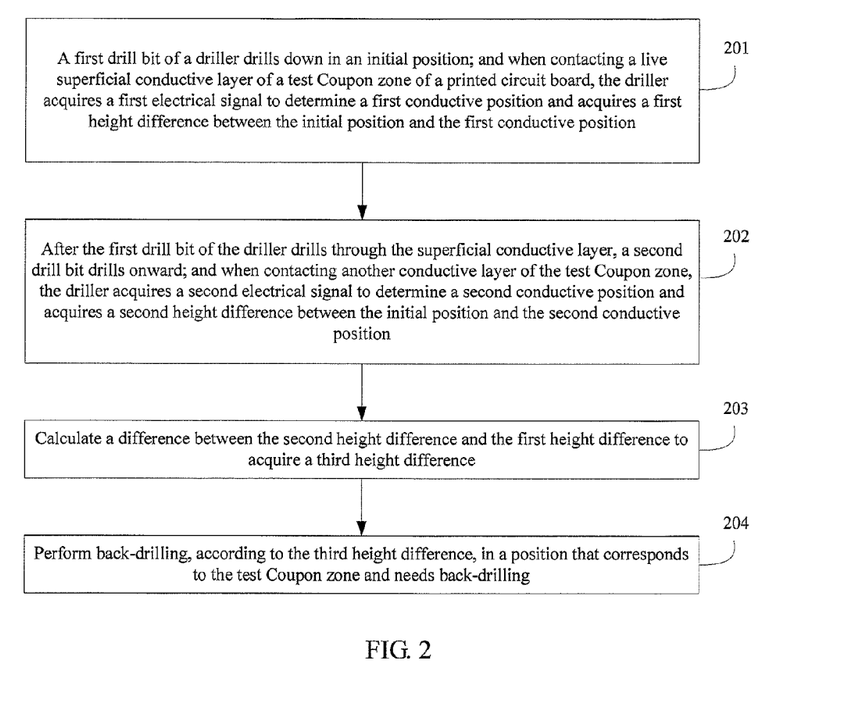
FIG. 2 is a flowchart of a method for drilling a PCB according to an embodiment of the present invention.

The foregoing embodiment describes the PCB provided in the present invention, and the following describes a method for drilling a PCB by using an embodiment of the present invention. FIG. 2 is a flowchart of a method for drilling a PCB according to an embodiment of the present invention. A body for executing this embodiment is a driller, and this embodiment expounds how the driller tests a blind via to acquire back-drilling depth for back-drilling. As shown in FIG. 2, this embodiment includes the following steps:

Step 201. A first drill bit of the driller drills down in an initial position; and when contacting a live superficial conductive layer of a test Coupon zone of a PCB, the driller acquires a first electrical signal to determine a first conductive position and acquires a first height difference between the initial position and the first conductive position.

Specifically, the initial position is a position from which a first drill bit starts drilling down. When drilling the PCB, the driller controls the first drill bit to start drilling in the initial position. When the first drill bit contacts the live superficial conductive layer of the test Coupon zone of the PCB, the live superficial conductive layer, a control circuit of the driller, and the first drill bit forma first loop to generate the first electrical signal. At this time, the driller acquires the position of the drill bit as the first conductive position, and calculates a height difference between the initial position and the first conductive position as the first height difference.

After acquiring the first conductive position, the driller controls the first drill bit to drill a first blind via on the superficial conductive layer. The bottom of the first blind via is positioned between the superficial conductive layer and an adjacent conductive layer.

Step 202. After the first drill bit of the driller drills through the superficial conductive layer, a second drill bit drills onward, and when contacting another conductive layer of the test Coupon zone of the PCB, the driller acquires a second electrical signal to determine a second conductive position and acquires a second height difference between the initial position and the second conductive position.

After the first blind via is drilled, a second drill bit smaller than the first drill bit takes over to drill onward in the same position so that a second blind via with its diameter being a second diameter is drilled. When drilling to some extent, the drill bit contacts the another conductive layer of the test Coupon zone of the PCB. At this time, the another conductive layer, the superficial conductive layer, a control circuit of the driller, and the second drill bit can form a second loop through the conductive layer on the wall of a through hole of the PCB to generate a second electrical signal, and the driller imports an electric current through the second loop. The through hole is an existing PTH hole in the partition. Through the hole, connection to the superficial surface is implemented. The superficial layer is connected to the control circuit of the driller, and therefore, the another conductive layer, the superficial conductive layer, the control circuit of the driller, and the second drill bit can form the second loop through a via of the PCB. The main unit of the driller imports an electric current, acquires the position of the drill bit as a second conductive position, and calculates the height difference between the initial position and the second conductive position as a second height difference.

Certainly, when the second drill bit contacts the another conductive layer of the test Coupon zone of the PCB, the another conductive layer, the superficial conductive layer, the control circuit of the driller, and the second drill bit can form a third loop through a wire led out from the another conductive layer of the test Coupon zone to generate a second electrical signal, and the driller imports an electric current through the third loop. The wire led out from the another conductive layer of the test Coupon zone is a lead wire that leads the another conductive layer of the test Coupon zone to an edge of the PCB board and to the driller. In this way, the another conductive layer, the superficial conductive layer, the control circuit of the driller, and the second drill bit can form a third loop through the wire led out from the another conductive layer of the test Coupon zone; and the driller imports an electric current, acquires the position of the drill bit as a second conductive position, and calculates the height difference between the initial position and the second conductive position as a second height difference.

It should be noted that the first diameter of the first blind via should be greater than the second diameter of the second blind via, preventing that the driller can always import the electric current on the live superficial conductive layer of the test Coupon zone when the second drill bit drills down in the first conductive position. Otherwise, the driller is unable to determine whether the second drill bit contacts the another conductive layer, and goes on drilling down to a layer that cannot be drilled through.

Step 203. Calculate a difference between the second height difference and the first height difference to obtain a third height difference.

After acquiring the first height difference and the second height difference, the driller can use an internally set program to automatically calculate the difference between the second height difference and the first height difference to obtain the third height difference.

Certainly, so as to obtain a more accurate back-drilling depth, the driller may perform compensation on the basis of the third height difference, that is, add a compensation value on the basis of the third height difference, where the compensation value may be a positive value and may be a negative value. The back-drilling depth ensures that the back-drilling never reaches a layer that cannot be drilled through. The compensation value is set by the driller according to an actual situation to ensure that the back-drilling never reaches a layer that cannot be drilled through.

A test blind via that has been drilled may not be further processed, or may be plugged or drilled into a through hole. This is not limited in the present invention.

Step 204. Perform back-drilling, according to the third height difference, in a position that corresponds to the test Coupon zone and needs back-drilling.

After compensation is performed and the back-drilling depth is obtained, the through hole that needs back-drilling may be back-drilled. The aperture of the back-drilling is greater than the aperture of the through hole, so that the copper plating on the wall of the through hole is scraped off. Because the back-drilling depth is obtained through the test blind via in this partition, the error is very small. Therefore, Stub length of the back-drilling is very short, which can greatly reduce loss of a hole in a high-speed high-frequency signal transmission process and improve integrity of a transmitted high-frequency signal.

Therefore, when back-drilling needs to be performed on a PCB that has a plurality of partitions, each of which includes a test Coupon zone, a first drill bit of a driller in the embodiment of the present invention drills down in an initial position, and when the first drill bit contacts a live superficial conductive layer of a test Coupon zone of the PCB, the driller acquires a first electrical signal to determine a first conductive position and acquires a first height difference between the initial position and the first conductive position; a second drill bit of the driller drills onward, and when the second drill bit contacts another conductive layer of the test Coupon zone of the PCB, the driller acquires a second electrical signal to determine a second conductive position and acquires a second height difference between the initial position and the second conductive position; a difference between the second height difference and the first height difference is calculated to obtain a third height difference; and back-drilling is performed according to the third height difference in a position that corresponds to the test Coupon zone and needs back-drilling. Therefore, the embodiments of the present invention can acquire precise depth information through a test blind via, reduce Stub length of back-drilling, implement high-precision back-drilling for a PCB board, and therefore reduce loss of a hole in a high-speed high-frequency signal transmission process and improve integrity of a transmitted signal.

Figure 3:
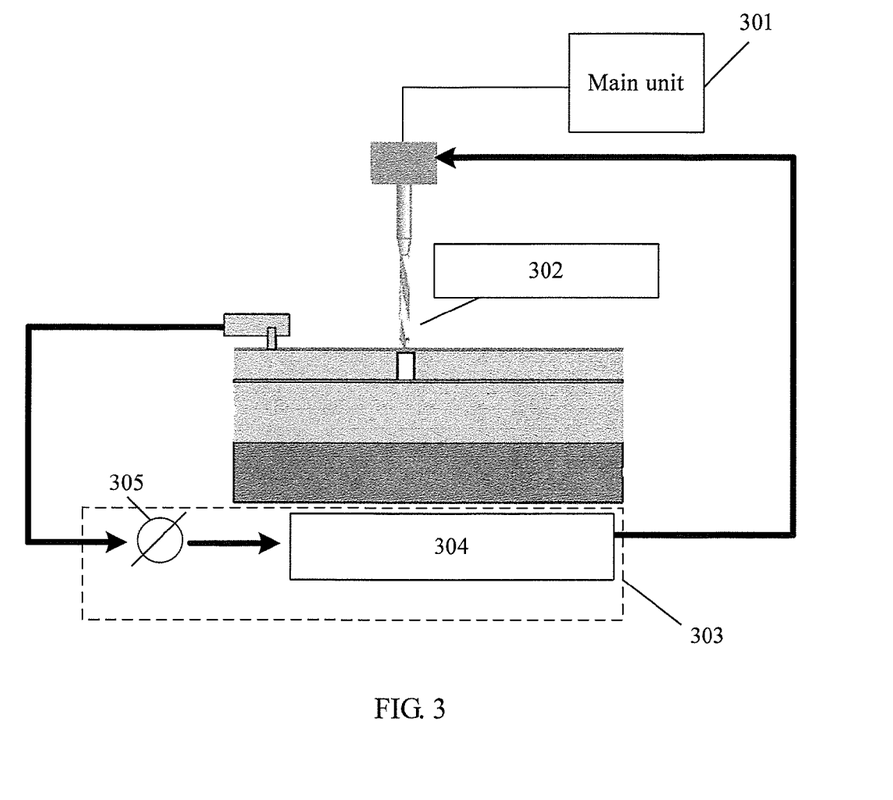
FIG. 3 is a schematic diagram of an apparatus for drilling a PCB according to an embodiment of the present invention.

Correspondingly, an embodiment of the present invention further provides an apparatus for drilling a PCB. The apparatus is configured to drill a PCB, where the PCB includes a plurality of conductive layers and insulation layers isolating the conductive layers. FIG. 3 is a schematic diagram of an apparatus for drilling a PCB according to an embodiment of the present invention. As shown in FIG. 3, the apparatus includes a main unit 301 and drill bits 302. The main unit 301 includes a controller 303, where: the controller 303 includes a control circuit 304 and a sensor 305. The drill bits 302 have two types: a first drill bit, and a second drill bit whose aperture is smaller than that of the first drill bit.

The main unit 301 includes a controller 303, where: the controller 303 includes a control circuit 304 and a sensor 305; the control circuit controls the first drill bit to drill down in an initial position until a superficial conductive layer of a test Coupon zone of the PCB is drilled through; when the first drill bit contacts the superficial conductive layer, the sensor acquires a first electrical signal to determine a first conductive position and acquires a first height difference between the initial position and the first conductive position; the control circuit controls the second drill bit to drill onward in a position where the first drill bit drills through the superficial conductive layer; and when the second drill bit contacts another conductive layer of the test Coupon zone of the PCB, the sensor acquires a second electrical signal to determine a second conductive position and acquires a second height difference between the initial position and the second conductive position.

The first drill bit is configured to drill through the superficial conductive layer of the test Coupon zone to obtain a first blind via with its aperture being a first diameter. The bottom of the first blind via is positioned between the superficial conductive layer and an adjacent conductive layer.

Specifically, when the first drill bit contacts the live superficial conductive layer of the test Coupon zone of the PCB, the superficial conductive layer, a control circuit of the driller, and the first drill bit form a first loop to generate the first electrical signal.

The second drill bit is configured to drill a second blind via with its aperture being a second diameter under the superficial conductive layer. The bottom of the second blind via is positioned on a surface of or inside another conductive layer.

It should be noted that the first diameter of the first blind via should be greater than the second diameter of the second blind via, preventing that the driller can always import the electric current on the live superficial conductive layer of the test Coupon zone when the second drill bit drills down in the first conductive position. Otherwise, the driller is unable to determine whether the drill bit contacts the another conductive layer, and goes on drilling down to a layer that cannot be drilled through.

Specifically, when the second drill bit contacts the another conductive layer of the test Coupon zone of the PCB, the another conductive layer, the superficial conductive layer, a control circuit, and the second drill bit form a second loop through a conductive layer on the inner wall of the through hole to generate the second electrical signal; or, when the second drill bit contacts the another conductive layer of the test Coupon zone of the PCB, the another conductive layer, the superficial conductive layer, the control circuit of the driller, and the second drill bit form a third loop through a wire led out from the another conductive layer to generate the second electrical signal.

The main unit 301 calculates a difference between the second height difference and the first height difference to obtain a third height difference, and controls a back-drilling drill bit to perform back-drilling, according to the third height difference, in a position that corresponds to the test Coupon zone and needs back-drilling.

Specifically, the main unit 301 is further configured to perform compensation for the third height difference, and the main unit 301 is configured to control the back-drilling drill bit to perform back-drilling, according to the back-drilling depth, in the position that corresponds to the test Coupon zone and needs back-drilling.

After compensation is performed and the back-drilling depth is obtained, the through hole that needs back-drilling may be back-drilled. The aperture of the back-drilling is greater than the aperture of the through hole, so that the copper plating on the wall of the through hole is scraped off. Because the back-drilling depth is obtained by drilling a blind via in the test Coupon zone of the partition, the error is very small. Therefore, Stub length of the back-drilling is very short, which can greatly reduce loss of a hole in a high-speed high-frequency signal transmission process and improve integrity of a transmitted high-frequency signal.

Therefore, when back-drilling needs to be performed on a PCB that has a plurality of partitions, where each partition includes a test blind via, the apparatus provided in the embodiment of the present invention can acquire precise depth information through a test Coupon zone, reduce Stub length of back-drilling, implement high-precision back-drilling for a PCB board, and therefore reduce loss of a hole in a high-speed high-frequency signal transmission process and improve integrity of a transmitted signal.

A person skilled in the art may further appreciate that the various units and algorithm steps described with reference to the embodiments disclosed herein can be implemented by electronic hardware, computer software, or a combination thereof. To illustrate the interchangeability of hardware and software, various illustrative components and steps have been described above generally in terms of their functionality. Whether the functions are performed by hardware or software depends on particular applications and design constraint conditions of the technical solutions. A person skilled in the art may use different methods to implement the described functions for each particular application, but it should not be considered that such implementation goes beyond the scope of the present invention.

The steps of a method or algorithm described with reference to the embodiments disclosed herein can be embodied directly in hardware, in a software module executed by a processor, or in a combination of the two. A software module can reside in a random access memory (RAM), flash memory, read-only memory (ROM), electrically programmable ROM, electrically erasable programmable ROM, register, hard disk, removable disk, CD-ROM, or any other form of storage medium known in the technical field.

The objectives, technical solutions, and benefits of the present invention are further described in detail in the foregoing specific implementation manners. It should be understood that the foregoing descriptions are merely specific implementation manners of the present invention, but are not intended to limit the protection scope of the present invention. Any modification, equivalent replacement, or improvement made within the spirit and principle of the present invention shall fall within the protection scope of the present invention.

What is claimed is:

1. A method for drilling a printed circuit board, the method comprising:
    drilling down, by a first drill bit of a driller, in an initial position; and when contacting a live superficial conductive layer of a test Coupon zone of a printed circuit board, acquiring, by the driller, a first electrical signal to determine a first conductive position and acquiring a first height difference between the initial position and the first conductive position;
    drilling onward, by a second drill bit, after the first drill bit of the driller drills through the superficial conductive layer; and when contacting another conductive layer of the test Coupon zone of the printed circuit board, acquiring, by the driller, a second electrical signal to determine a second conductive position and acquiring a second height difference between the initial position and the second conductive position;
    calculating a difference between the second height difference and the first height difference to obtain a third height difference; and
    performing back-drilling, according to the third height difference, in a position that corresponds to the test Coupon zone and needs back-drilling,
    wherein acquiring, by the driller, the first electrical signal comprises:
    when the first drill bit contacts the live superficial conductive layer of the test Coupon zone of the printed circuit board, the live superficial conductive layer, a through hole, a control circuit of the driller, and the first drill bit form a first loop to generate the first electrical signal,
    and wherein acquiring, by the driller, the second electrical signal comprises:
    when the second drill bit contacts the another conductive layer of the test Coupon zone of the printed circuit board, the another conductive layer, the superficial conductive layer, the through hole, the control circuit of the driller, and the second drill bit form a second loop through a conductive layer on the inner wall of the through hole to generate the second electrical signal.

2. The method for drilling a printed circuit board according to claim 1, wherein drilling onward by the second drill bit comprises:
    drilling, by the first drill bit, a first blind via with its aperture being a first diameter on the live superficial conductive layer of the test Coupon zone and, drilling, by the second drill bit, a second blind via with its aperture being a second diameter.

3. The method for drilling a printed circuit board according to claim 1, wherein:
    after calculating the difference between the second height difference and the first height difference to obtain the third height difference, the method further comprises: performing compensation for the third height difference to obtain back-drilling depth; and
    performing back-drilling comprises: performing back-drilling, according to the back-drilling depth, in a position that corresponds to the test Coupon zone and needs back-drilling.

4. The method for drilling a printed circuit board according to claim 2, wherein the first diameter is greater than the second diameter.

5. An apparatus for drilling a printed circuit board, the printed circuit board comprising a plurality of conductive layers and insulation layers isolating the conductive layers, the apparatus comprising:
    a main unit, a first drill bit, and a second drill bit whose aperture is smaller than that of the first drill bit;
    wherein the main unit comprises a controller, wherein: the controller comprises a control circuit and a sensor; the control circuit controls the first drill bit to drill down in an initial position until a superficial conductive layer of a test Coupon zone of the printed circuit board is drilled through; when the first drill bit contacts the superficial conductive layer, the sensor acquires a first electrical signal to determine a first conductive position and acquires a first height difference between the initial position and the first conductive position; the control circuit controls the second drill bit to drill onward in a position where the first drill bit drills through the superficial conductive layer; and when the second drill bit contacts another conductive layer of the test Coupon zone of the printed circuit board, the sensor acquires a second electrical signal to determine a second conductive position and acquires a second height difference between the initial position and the second conductive position; and wherein the main unit calculates a difference between the second height difference and the first height difference to obtain a third height difference, and controls a back-drilling drill bit to perform back-drilling, according to the third height difference, in a position that corresponds to the test Coupon zone and needs back-drilling, wherein the first drill bit is configured to drill through the superficial conductive layer of the test Coupon zone to acquire a first blind via with its aperture being a first diameter; and the second drill bit is configured to drill a second blind via with its aperture being a second diameter under the superficial conductive layer, wherein the bottom of the second blind via is positioned on a surface of, inside, or under another conductive layer, wherein when the first drill bit contacts the live superficial conductive layer of the test Coupon zone of the printed circuit board, the superficial conductive layer, a through hole, a control circuit of the driller, and the first drill bit form a first loop to generate the first electrical signal, and wherein: when the second drill bit contacts the another conductive layer of the test Coupon zone of the printed circuit board, the another conductive layer, the superficial conductive layer, the through hole, the control circuit, and the second drill bit form a second loop through a conductive layer on the inner wall of the through hole to generate the second electrical signal.

6. The apparatus for drilling a printed circuit board according to claim 5, wherein the main unit is further configured to perform compensation for the third height difference to obtain back-drilling depth; and the main unit is configured to control a back-drilling drill bit to perform back-drilling, according to the back-drilling depth, in a position that corresponds to the test Coupon zone and needs back-drilling.

7. The apparatus for drilling a printed circuit board according to claim 5, wherein the first diameter is greater than the second diameter.

8. A method for drilling a printed circuit board, the method comprising:

drilling down, by a first drill bit of a driller, in an initial position; and when contacting a live superficial conductive layer of a test Coupon zone of a printed circuit board, acquiring, by the driller, a first electrical signal to determine a first conductive position and acquiring a first height difference between the initial position and the first conductive position;

drilling onward, by a second drill bit, after the first drill bit of the driller drills through the superficial conductive layer; and when contacting another conductive layer of the test Coupon zone of the printed circuit board, acquiring, by the driller, a second electrical signal to determine a second conductive position and acquiring a second height difference between the initial position and the second conductive position;

calculating a difference between the second height difference and the first height difference to obtain a third height difference; and performing back-drilling, according to the third height difference, in a position that corresponds to the test Coupon zone and needs back-drilling, wherein acquiring, by the driller, the first electrical signal comprises:

when the first drill bit contacts the live superficial conductive layer of the test Coupon zone of the printed circuit board, the live superficial conductive layer, a through hole, a control circuit of the driller, and the first drill bit form a first loop to generate the first electrical signal, and wherein acquiring, by the driller, the second electrical signal comprises:

when the second drill bit contacts the another conductive layer of the test Coupon zone of the printed circuit board, the another conductive layer, the superficial conductive layer, the through hole, the control circuit of the driller, and the second drill bit form a third loop through a wire led out from the another conductive layer to generate the second electrical signal.

9. The method for drilling a printed circuit board according to claim 8, wherein drilling onward by the second drill bit comprises:

drilling, by the first drill bit, a first blind via with its aperture being a first diameter on the live superficial conductive layer of the test Coupon zone and, drilling, by the second drill bit, a second blind via with its aperture being a second diameter.

10. The method for drilling a printed circuit board according to claim 8, wherein:

after calculating the difference between the second height difference and the first height difference to obtain the third height difference, the method further comprises: performing compensation for the third height difference to obtain back-drilling depth; and performing back-drilling comprises: performing back-drilling, according to the back-drilling depth, in a position that corresponds to the test Coupon zone and needs back-drilling.

11. The method for drilling a printed circuit board according to claim 9, wherein the first diameter is greater than the second diameter.

12. An apparatus for drilling a printed circuit board, the printed circuit board comprising a plurality of conductive layers and insulation layers isolating the conductive layers, the apparatus comprising:

a main unit, a first drill bit, and a second drill bit whose aperture is smaller than that of the first drill bit;

wherein the main unit comprises a controller, wherein: the controller comprises a control circuit and a sensor; the control circuit controls the first drill bit to drill down in an initial position until a superficial conductive layer of a test Coupon zone of the printed circuit board is drilled through; when the first drill bit contacts the superficial conductive layer, the sensor acquires a first electrical signal to determine a first conductive position and acquires a first height difference between the initial position and the first conductive position; the control circuit controls the second drill bit to drill onward in a position where the first drill bit drills through the superficial conductive layer; and when the second drill bit contacts another conductive layer of the test Coupon zone of the printed circuit board, the sensor acquires a second electrical signal to determine a second conductive position and acquires a second height difference between the initial position and the second conductive position; and wherein the main unit calculates a difference between the second height difference and the first height difference to obtain a third height difference, and controls a back-drilling drill bit to perform in back-drilling, according to the third height difference, in a position that corresponds to the test Coupon zone and needs back-drilling, wherein the first drill bit is configured to drill through the superficial conductive layer of the test Coupon zone to acquire a first blind via with its aperture being a first diameter; and the second drill bit is configured to drill a second blind via with its aperture being a second diameter under the superficial conductive layer, wherein the bottom of the second blind via is positioned on a surface of, inside, or under another conductive layer, wherein when the first drill bit contacts the live superficial conductive layer of the test Coupon zone of the printed circuit board, the superficial conductive layer, a through hole, a control circuit of the driller, and the first drill bit form a first loop to generate the first electrical signal, and wherein: when the second drill bit contacts the another conductive layer of the test Coupon zone of the printed circuit board, the another conductive layer, the superficial conductive layer, the through hole, the control circuit of the driller, and the second drill bit form a third loop through a wire led out from the another conductive layer to generate the second electrical signal.

13. The apparatus for drilling a printed circuit board according to claim 12, wherein the main unit is further configured to perform compensation for the third height difference to obtain back-drilling depth; and the main unit is configured to control a back-drilling drill bit to perform back-drilling, according to the back-drilling depth, in a position that corresponds to the test Coupon zone and needs back-drilling.

14. The apparatus for drilling a printed circuit board according to claim 13, wherein the first diameter is greater than the second diameter.

* * * * *